United States Patent
Payak et al.

(10) Patent No.: US 11,927,635 B2
(45) Date of Patent: Mar. 12, 2024

(54) DETERMINING CHARGE PUMP EFFICIENCY USING CLOCK EDGE COUNTING

(71) Applicant: SanDisk Technologies LLC, Addison, TX (US)

(72) Inventors: Keyur Payak, Santa Clara, CA (US); Naveen Thomas, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 116 days.

(21) Appl. No.: 17/731,589

(22) Filed: Apr. 28, 2022

(65) Prior Publication Data

US 2023/0349972 A1    Nov. 2, 2023

(51) Int. Cl.
| | |
|---|---|
| H03K 17/00 | (2006.01) |
| G01R 31/28 | (2006.01) |
| G01R 31/317 | (2006.01) |
| G01R 31/319 | (2006.01) |
| H03K 17/693 | (2006.01) |

(52) U.S. Cl.
CPC ... *G01R 31/31905* (2013.01); *G01R 31/2879* (2013.01); *G01R 31/31727* (2013.01); *G01R 31/31924* (2013.01); *H03K 17/693* (2013.01)

(58) Field of Classification Search
CPC ....... G01R 31/31727; G01R 31/31905; H02M 3/073; H02M 3/072; H02M 3/075; H02M 3/076; H02M 3/077; H02M 3/078; H03K 17/693
See application file for complete search history.

(56) References Cited

U.S. PATENT DOCUMENTS

| | | | |
|---|---|---|---|
| 8,138,820 B2 | 3/2012 | Gebara | |
| 9,553,506 B1* | 1/2017 | Huynh | .......... H02M 3/07 |
| 10,114,392 B2 | 10/2018 | King | |
| 10,541,605 B2 | 1/2020 | Daniel | |
| 10,998,816 B1* | 5/2021 | Payak | .......... H02M 3/073 |
| 11,073,570 B1* | 7/2021 | Li | .......... G01R 31/40 |
| 2008/0036528 A1* | 2/2008 | Chen | .......... H02M 3/07 |
| | | | 327/536 |

(Continued)

OTHER PUBLICATIONS

Eid, M. H. et al.; Analysis and design of cross-coupled charge pump for low power on chip applications; Microelectronics Journal; May 17, 2017; pp. 9-17; vol. 66; Elsevier Ltd.

*Primary Examiner* — Tuan T Lam
(74) *Attorney, Agent, or Firm* — Hector A. Agdeppa; SHEPPARD, MULLIN, RICHTER & HAMPTON LLP

(57) ABSTRACT

A charge pump test configuration and corresponding method of operation are disclosed for determining charge pump efficiency without needing to obtain direct current measurements. A first number of clock edges (CEs) of a clock signal supplied to a first charge pump is determined over a period of time for a predetermined output current. The first charge pump is then connected with a charge pump under test (PUT) in a cascaded manner such that an output current of the first charge pump is supplied to the PUT as an input current. A second number of CEs of a clock signal supplied to the first charge pump is determined over the same period of time for the same predetermined output current from the PUT. The efficiency of the PUT can then be determined as the ratio of the first number of CEs to the second number of CEs, or vice versa.

20 Claims, 17 Drawing Sheets

(56) References Cited

U.S. PATENT DOCUMENTS

2011/0156805 A1\* 6/2011 Kwon ................ H02M 3/07
327/536
2016/0181913 A1\* 6/2016 Feng ................. H02M 3/07
327/536

\* cited by examiner

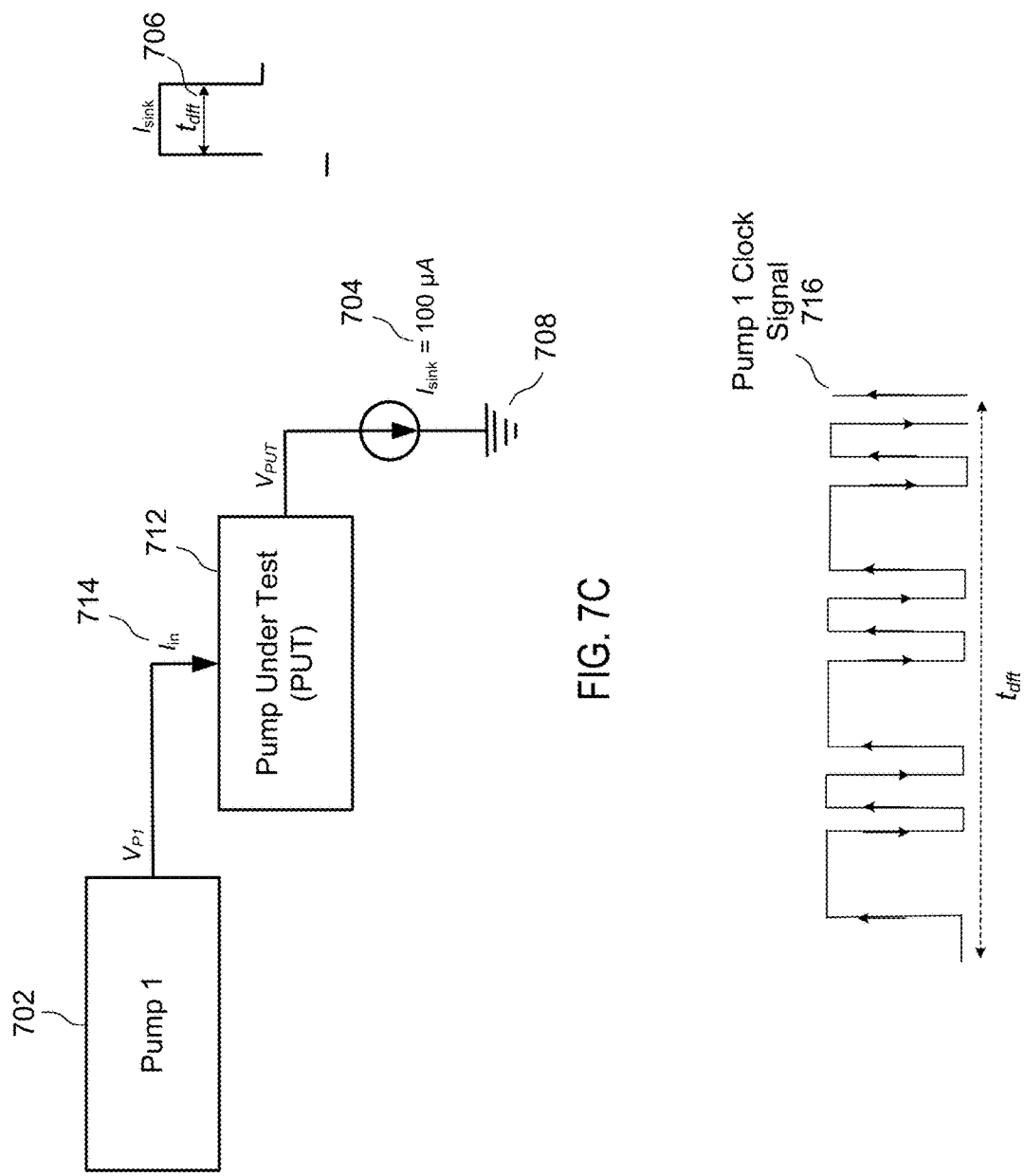

US 11,927,635 B2

1

DETERMINING CHARGE PUMP EFFICIENCY USING CLOCK EDGE COUNTING

BACKGROUND

Flash memory is an electronic, non-volatile computer memory storage medium that can be electrically erased and reprogrammed. Flash memory is now widely used across a range of products and industries including computers, smartphones, tablets, digital audio players, digital cameras, wearable devices, video games, scientific instrumentation, industrial robotics, medical electronics, and so forth. NAND flash memory—one of the two primary types of flash memory—has become the preferred choice of flash memory for memory cards, USB flash drives, solid-state drives, and the like. NAND flash may employ floating gate transistors (e.g., floating gate metal-oxide-semiconductor field-effect transistors (MOSFETs)) or charge trapping layer (CTL) transistors, connected in a manner that resembles a NAND logic gate. Various types of NAND flash technology exist and differ with respect to the number of programmable states they support, and thus, the number of bits of information that an individual memory cell can store.

Flash memory utilizes charge pumps to generate high voltages for various operations such as programming a cell, reading a cell's contents, and the like. For a given chip or across different chips, different charge pumps can have different operating efficiencies, which in turn, can contribute to different performance characteristics for the flash memory.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

2

Figure 4A:
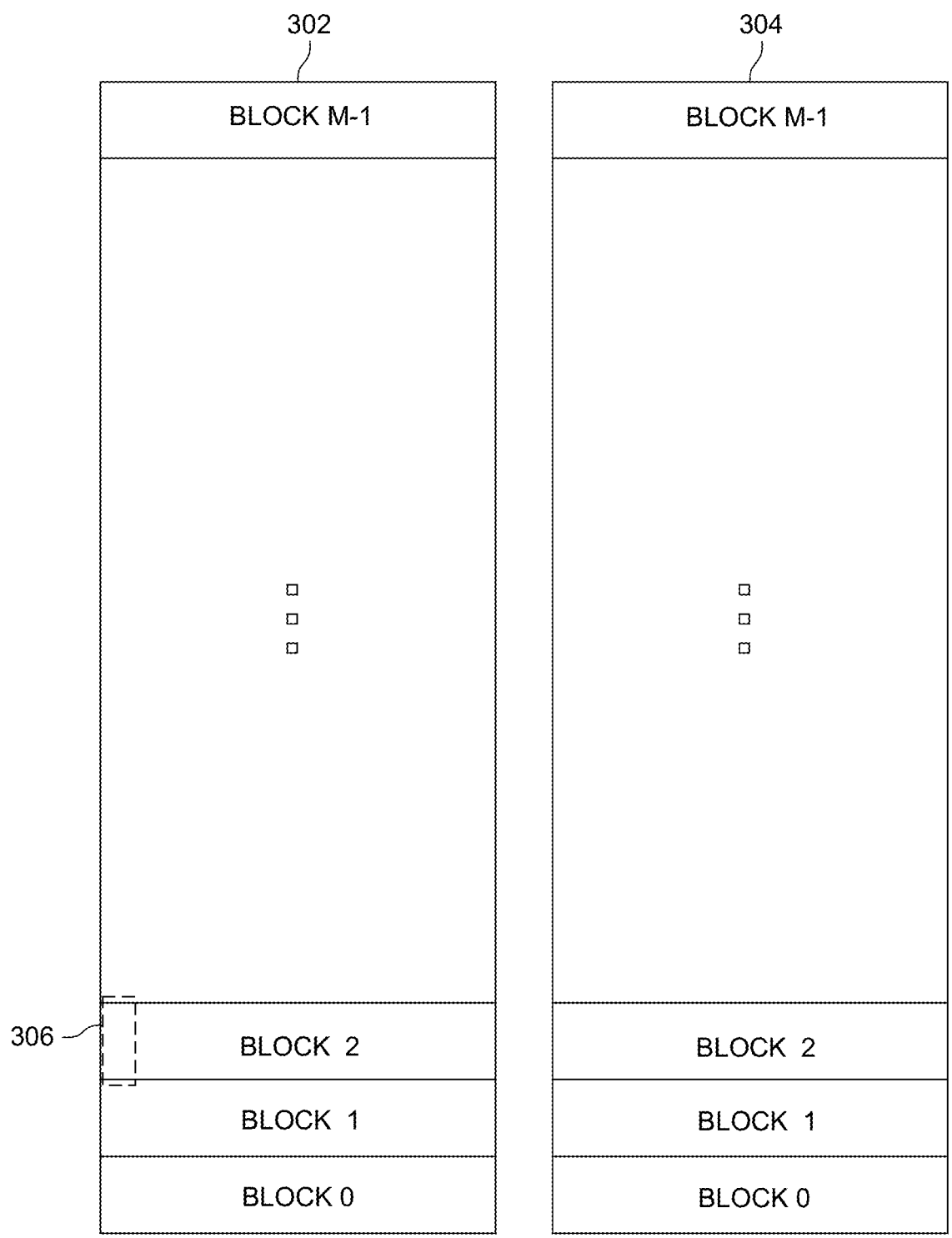
FIG. 4A is a block diagram of an example memory structure having two planes, in connection with which, example embodiments of the disclosed technology can be implemented.
Figure 4B:
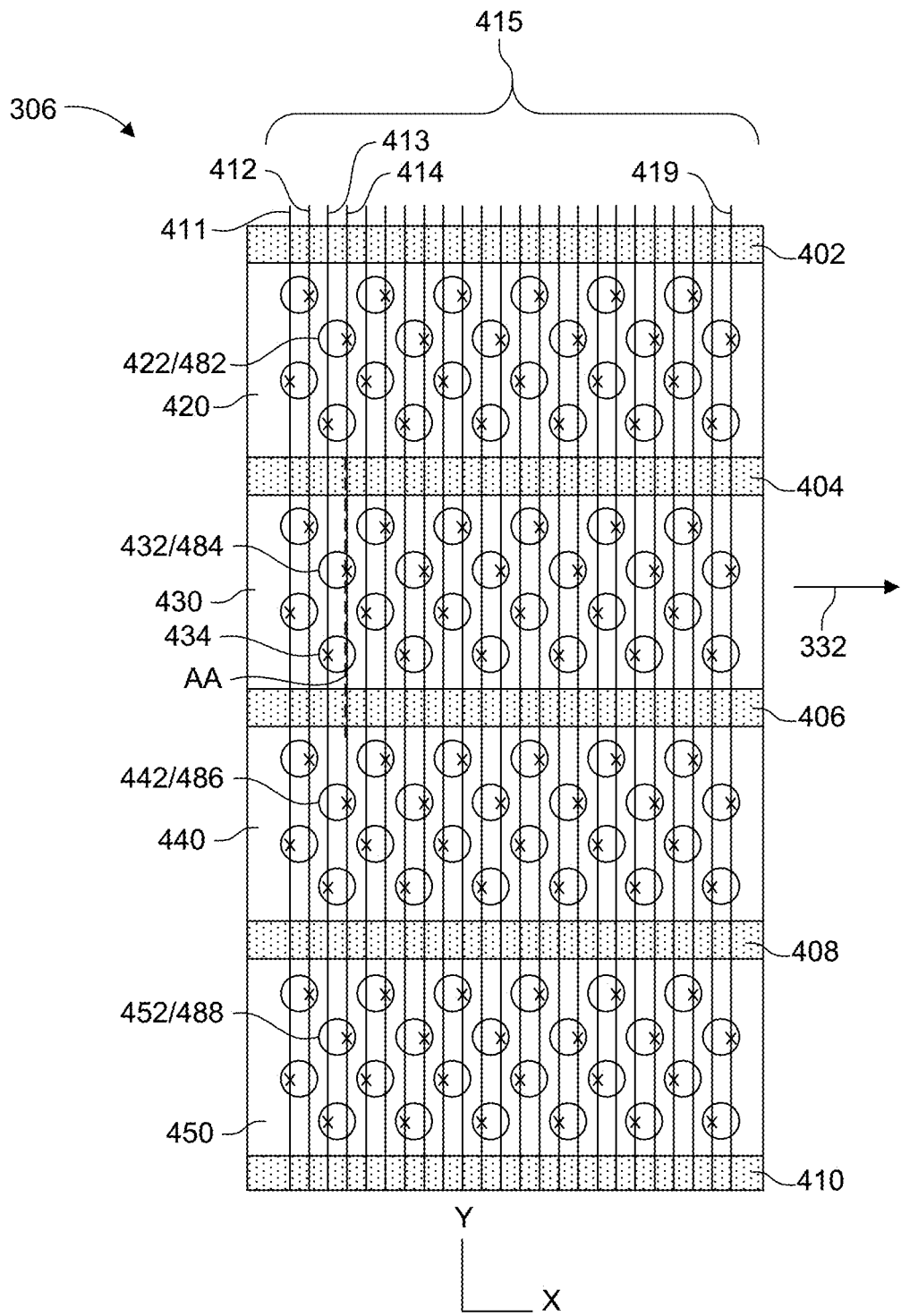
FIG. 4B depicts a top view of a portion of a block of example memory cells, in connection with which, example embodiments of the disclosed technology can be implemented.
Figure 4C:
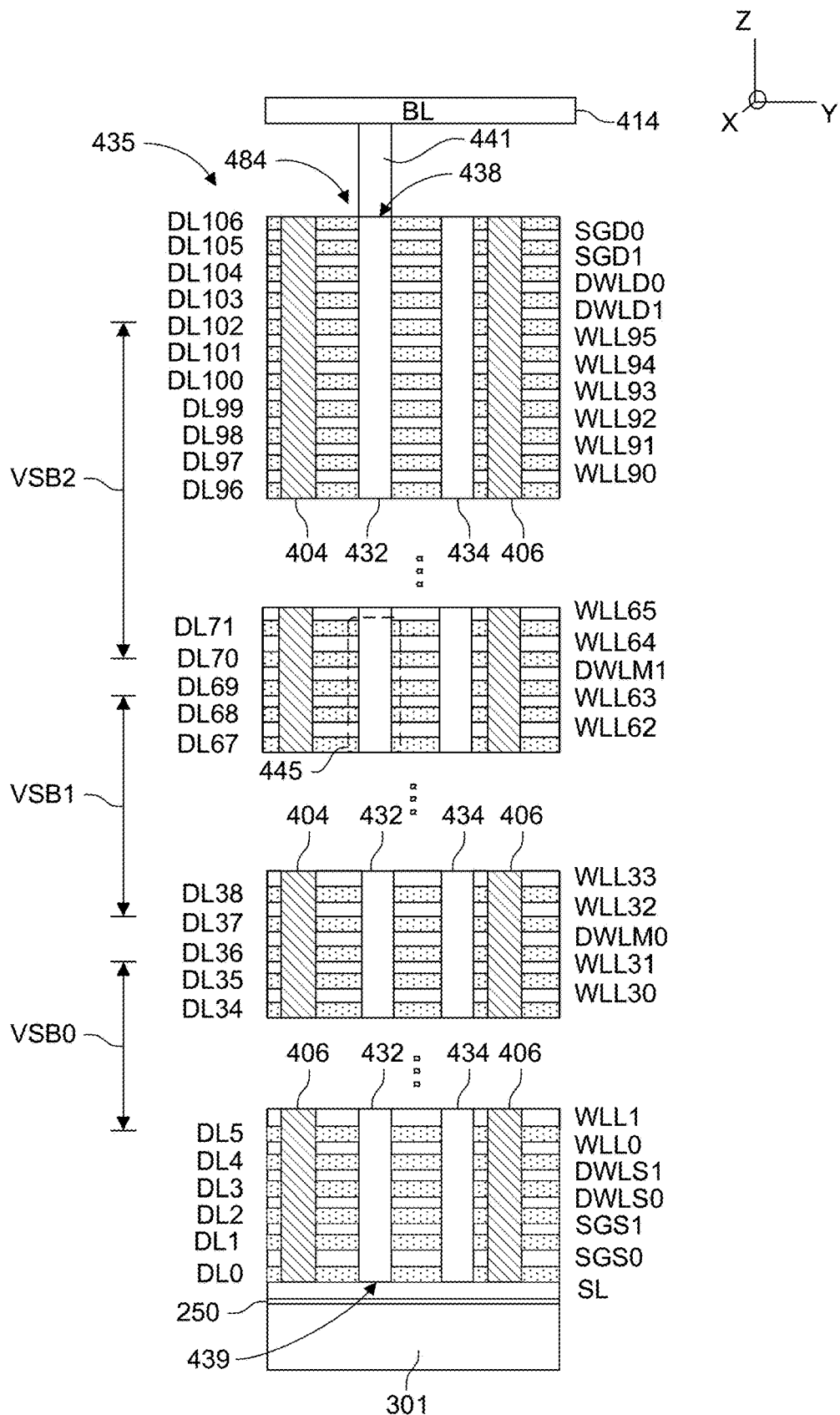
FIG. 4C depicts a stack showing a cross-sectional view along line AA of FIG. 4B.
Figure 4D:
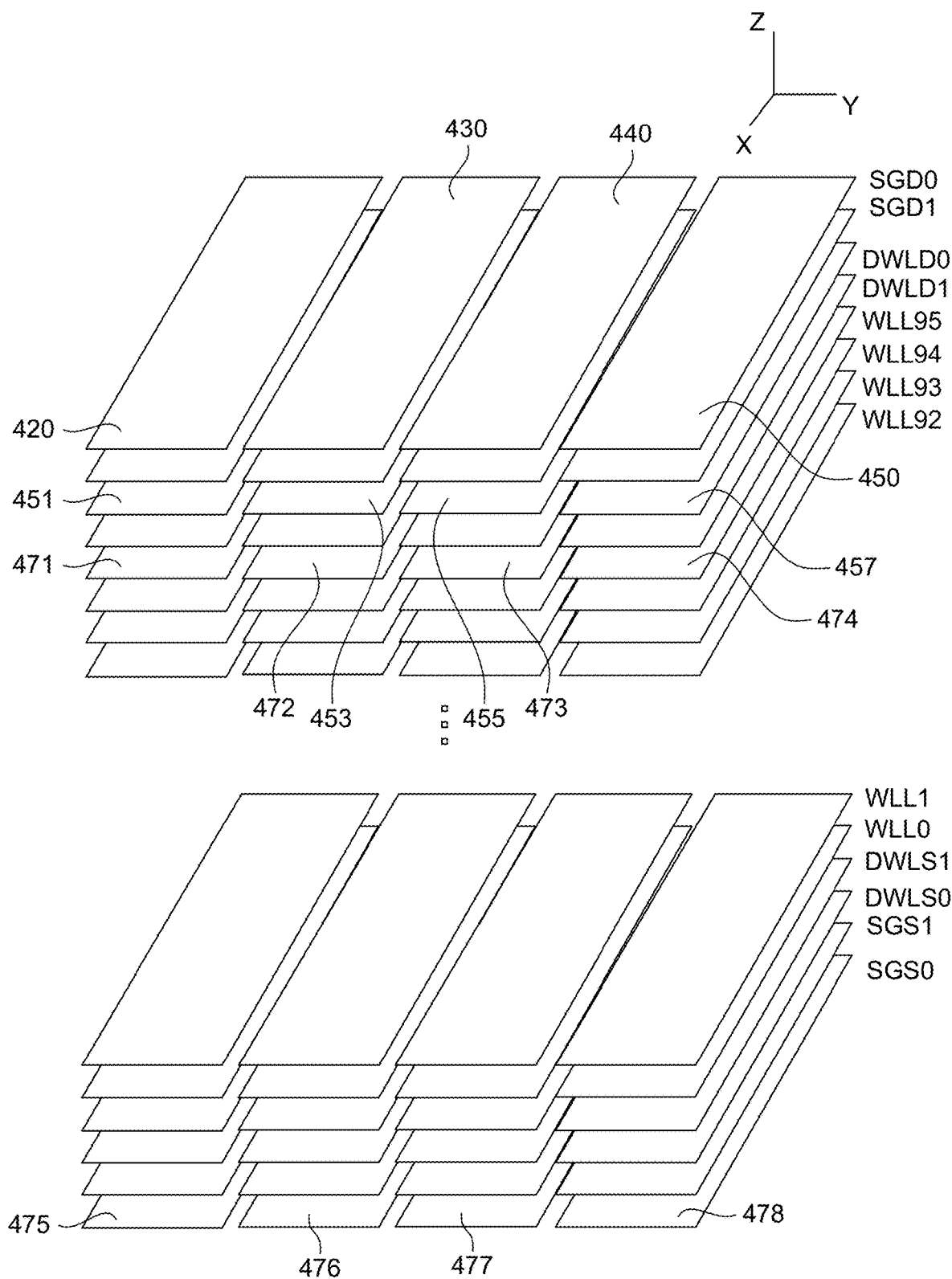
FIG. 4D depicts an alternative view of the select gate layers and wordline layers of the stack 435 of FIG. 4C.
Figure 4E:
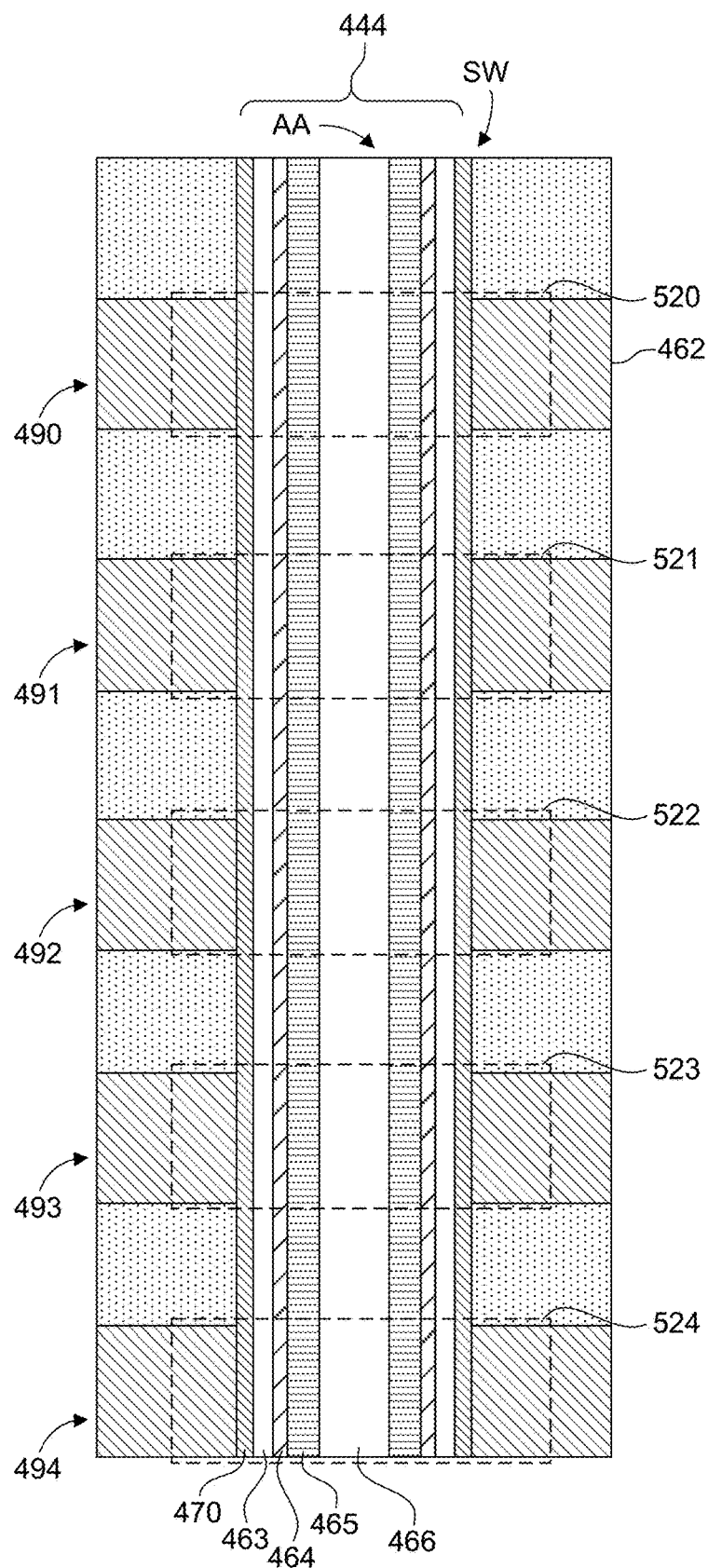
FIG. 4E depicts a view of the region 445 of FIG. 4C.
Figure 4F:
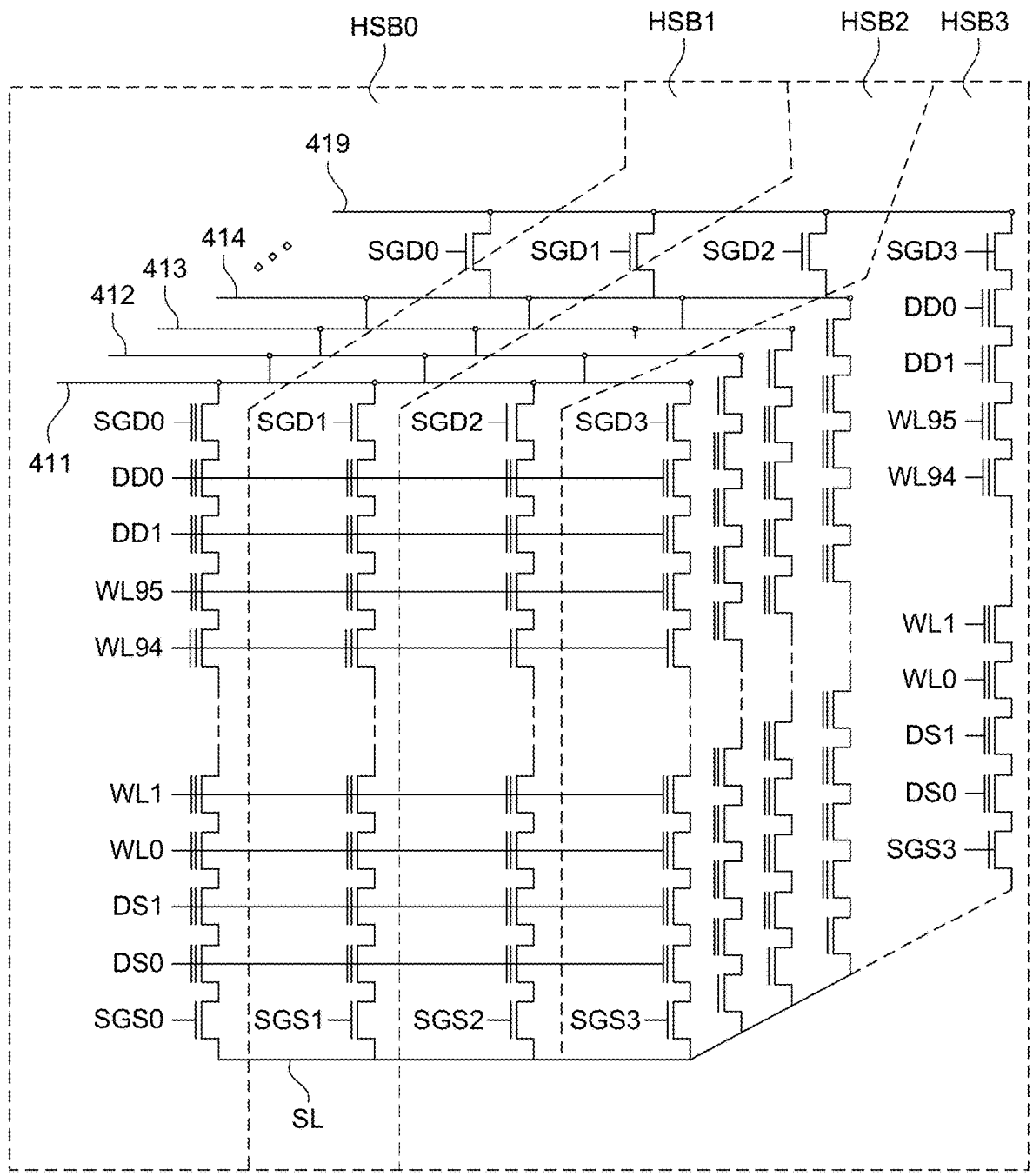
FIG. 4F is a schematic of a plurality of example NAND strings showing multiple horizontal sub-blocks, in connection with which, example embodiments of the disclosed technology can be implemented.
Figure 4G:
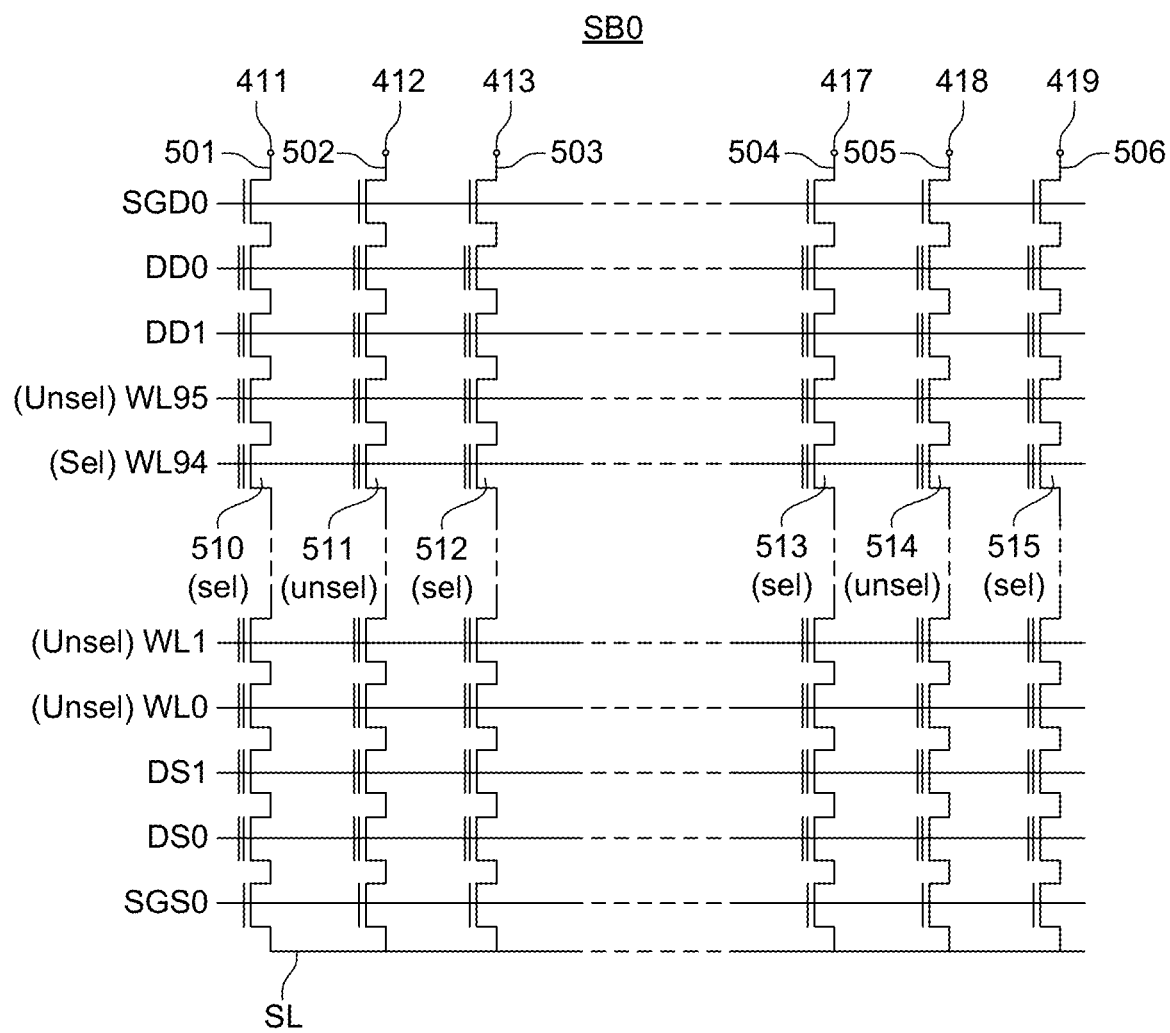

FIG. 4G is a schematic of a plurality of NAND strings showing one example horizontal sub-block, in connection with which, example embodiments of the disclosed technology can be implemented.

Figure 5:
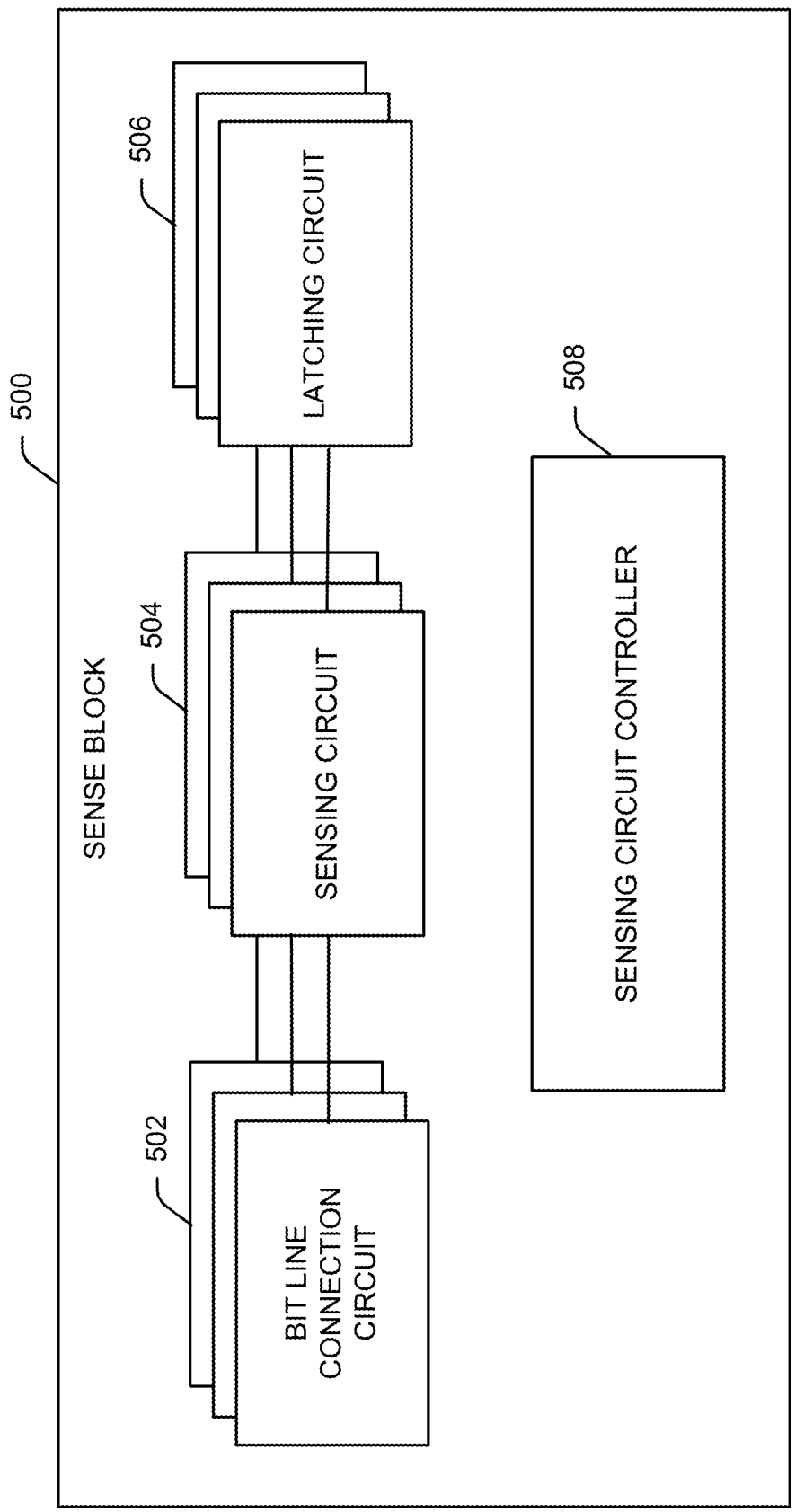

FIG. 5 is a schematic block diagram depicting an example configuration of a sense block of a memory die, in connection with which, example embodiments of the disclosed technology can be implemented.

Figure 6:
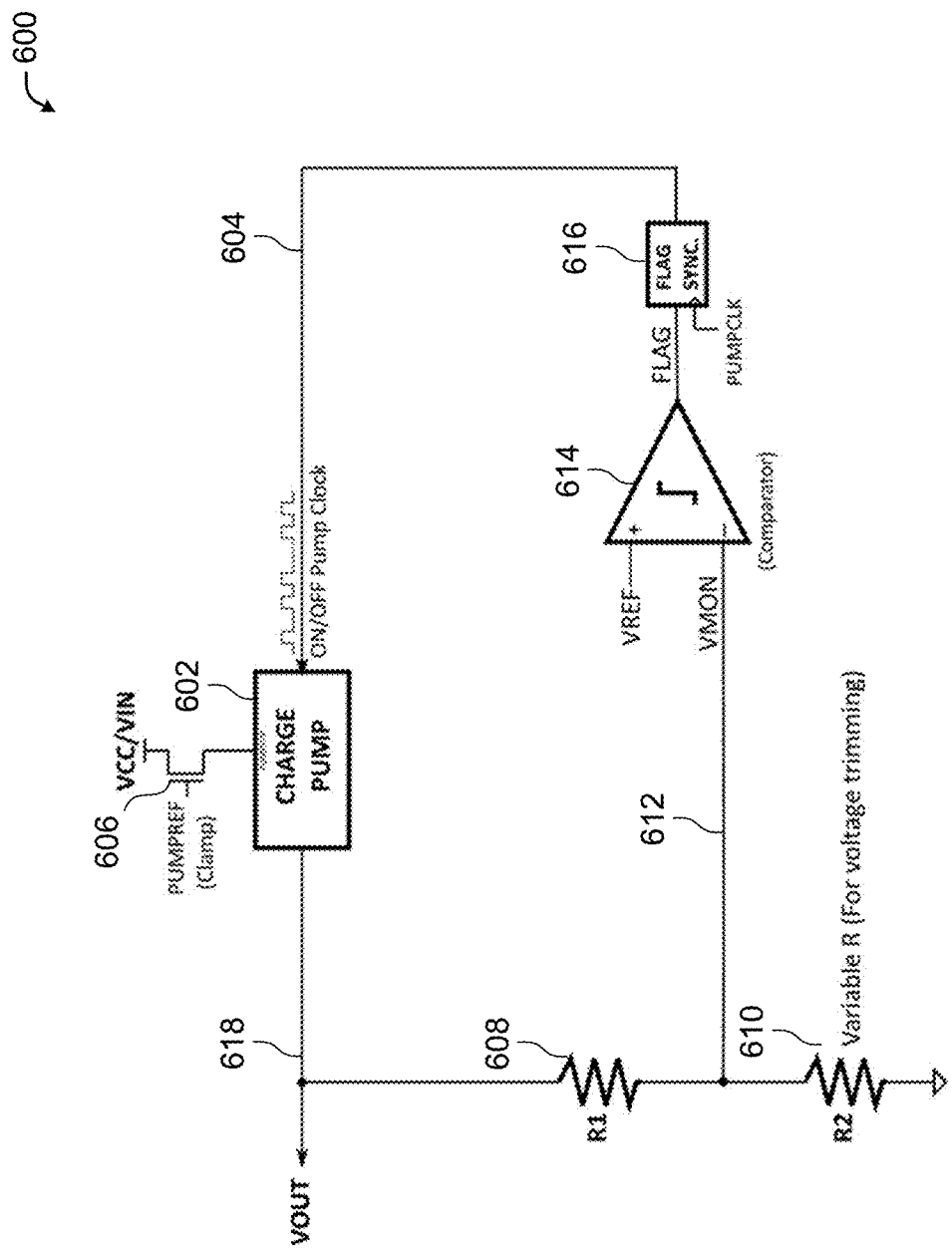

FIG. 6 schematically depicts a charge pump circuit.

Figure 7A:
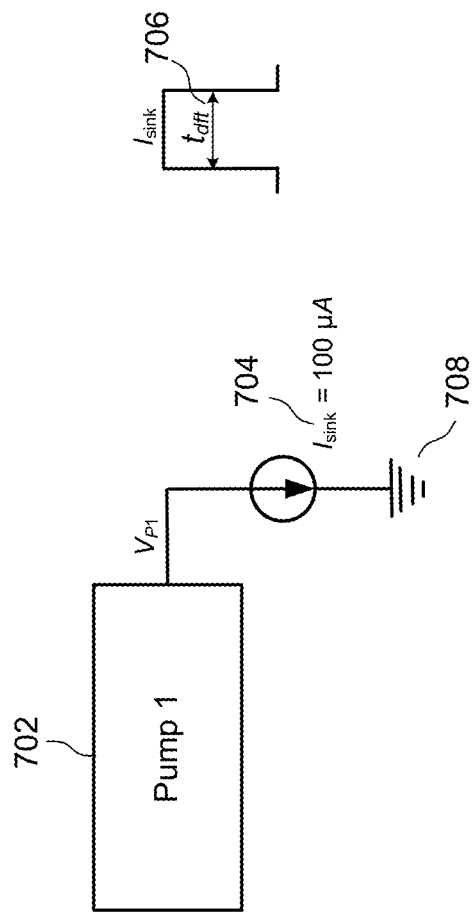

FIG. 7A schematically depicts a particular current output being drawn from a charge pump.

Figure 7B:
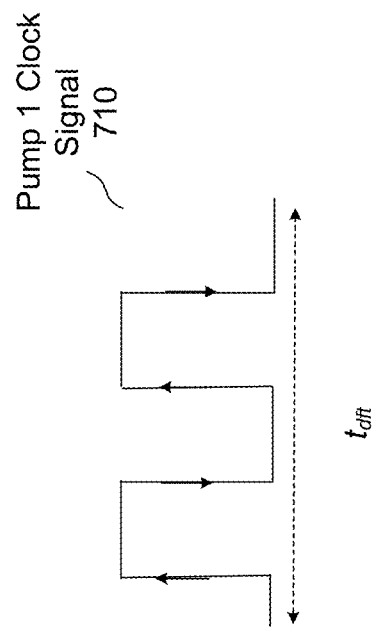

FIG. 7B depicts a clock signal that controls an output of the charge pump of FIG. 7A.

FIG. 7C schematically depicts a charge pump test configuration in which a pump under test is cascaded with the charge pump of FIG. 7A, according to example embodiments of the disclosed technology.

FIG. 7D depicts a clock signal for the charge pump of FIG. 7A having a greater number of clock edges in connection with the charge pump test configuration depicted in FIG. 7C, according to example embodiments of the disclosed technology.

Figure 8:
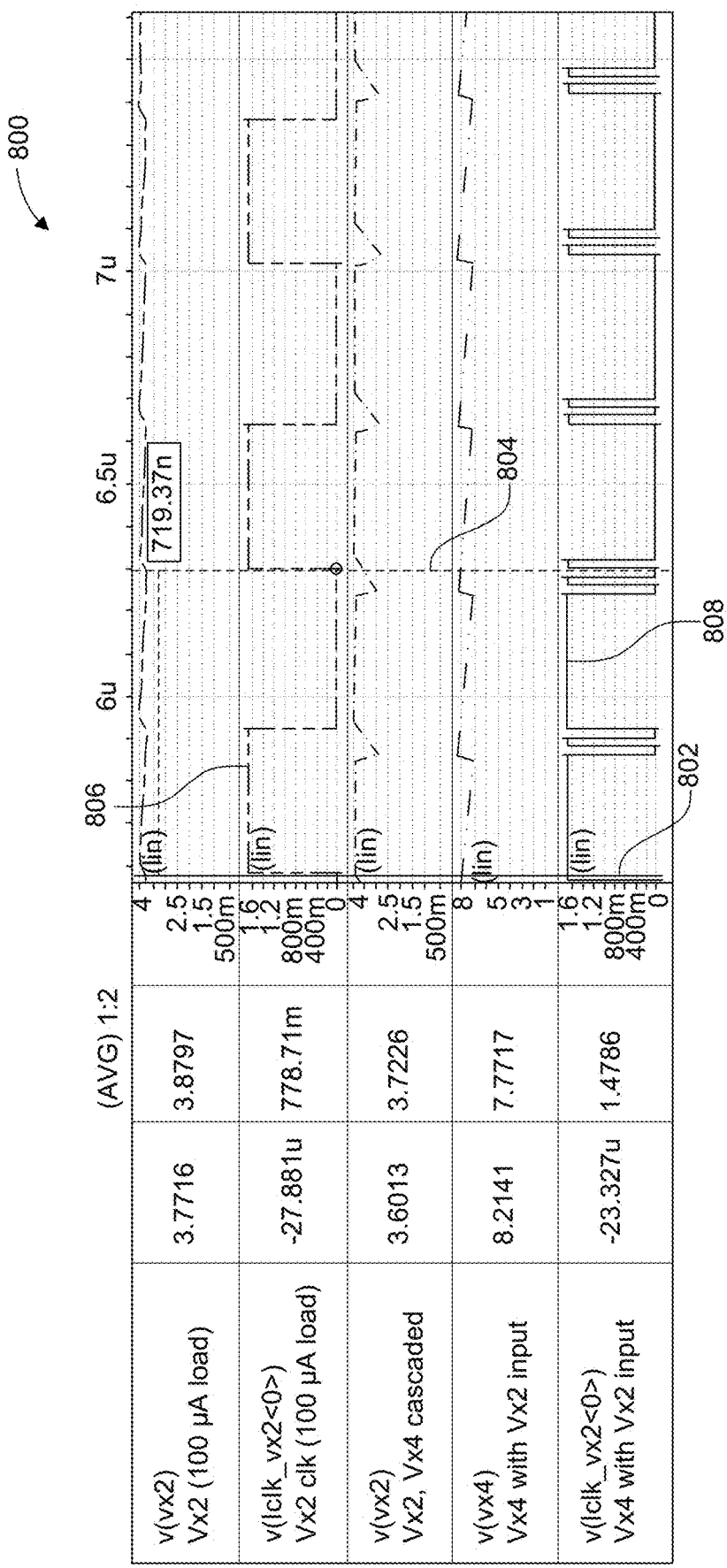

FIG. 8 depicts simulation results for the charge pump test configuration depicted in FIG. 7C, according to example embodiments of the disclosed technology.

Figure 9:
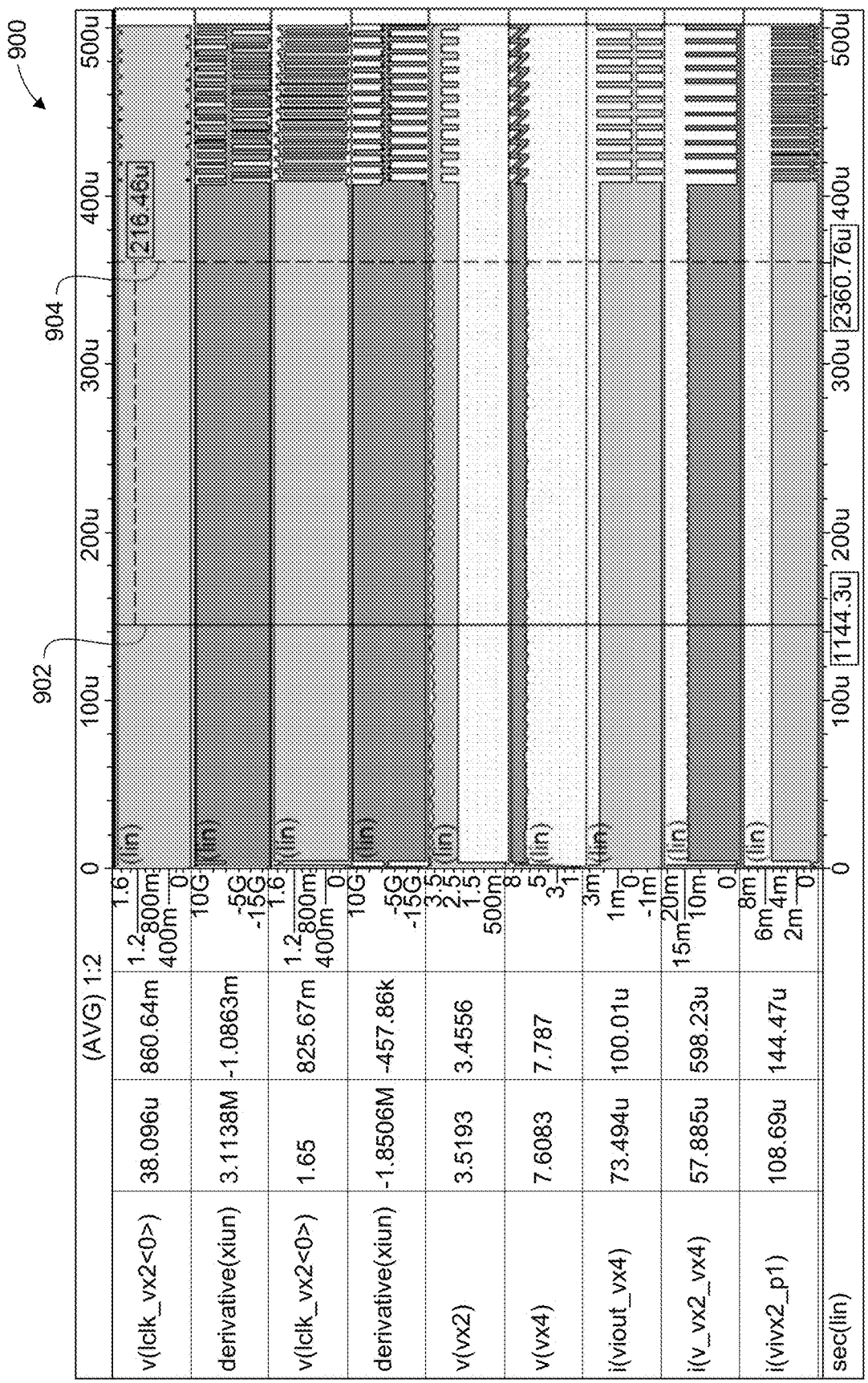

FIG. 9 depicts simulation results for the charge pump test configuration depicted in FIG. 7C over a longer time horizon than the simulation results of FIG. 8, according to example embodiments of the disclosed technology.

Figure 10:
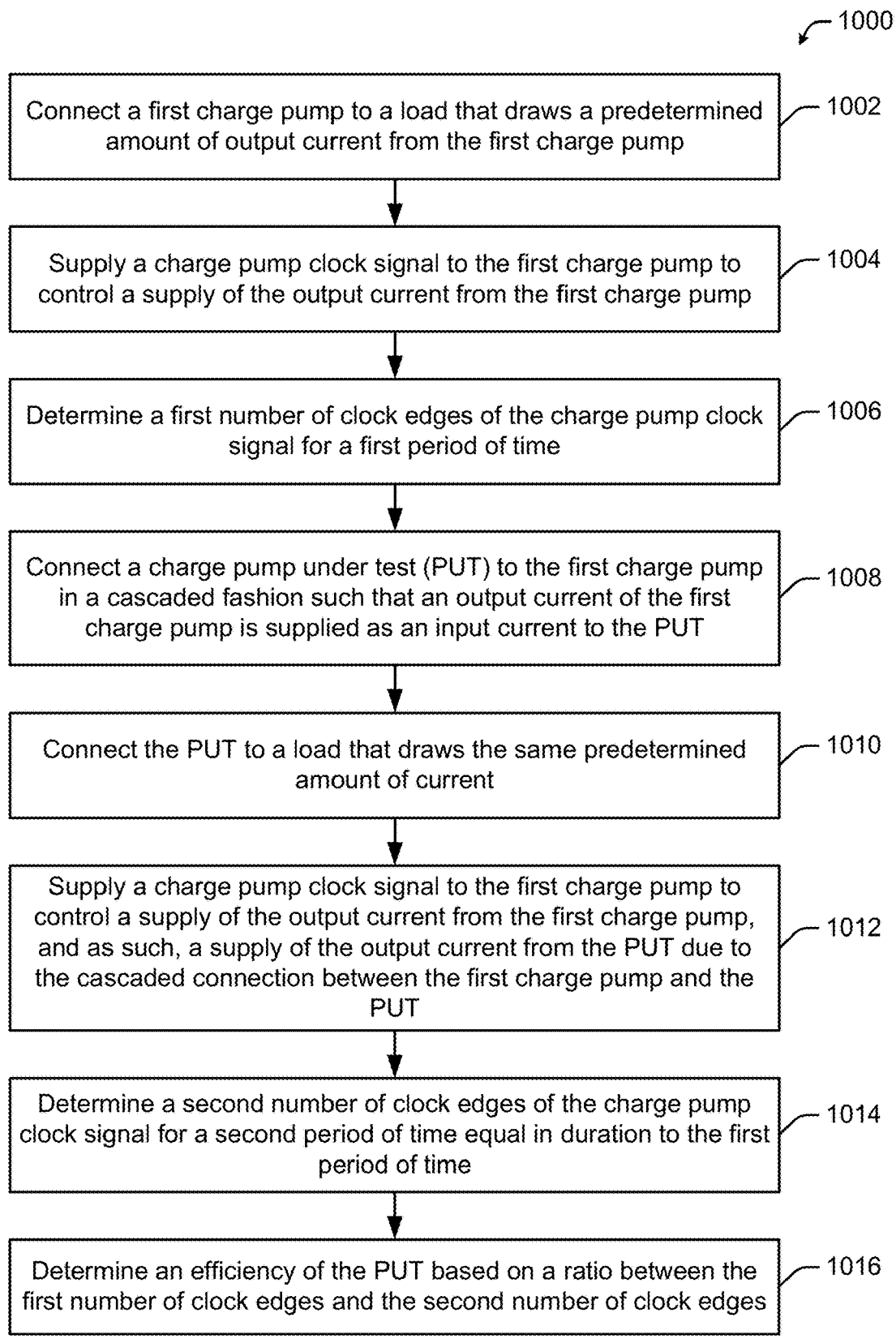

FIG. 10 is a flowchart of an illustrative method of operation of the charge pump test configuration depicted in FIG. 7C to measure the efficiency of a charge pump under test according to example embodiments of the disclosed technology.

The figures are not exhaustive and do not limit the present disclosure to the precise form disclosed.

DETAILED DESCRIPTION

NAND flash memory utilizes charge pumps for various operations such as to generate, from a source voltage, the high voltages needed to program flash memory cells, read cell contents, and so forth. Multiple NAND flash memory chips are typically formed on a wafer, with each chip including a certain number of charge pumps (e.g., 4-6 charge pumps). In some cases, different charge pumps may be used for different operations. In particular, different charge pumps may be capable of generating different amounts of output current, and thus, may charge to different maximum voltages. For instance, a particular charge pump may be used to generate a read reference voltage ($V_{READ}$) that may be applied to a wordline containing a cell whose stored contents are being read, while another charge pump capable of producing a greater amount of output current, for example, may be used to generate a programming voltage ($V_{PGM}$)—which is typically much larger than $V_{READ}$—to program a cell to a desired programmed state.

Just as every chip formed on a wafer behaves differently (e.g., has different operating characteristics such as a different cell programming time, cell reading time, etc.), each charge pump also generally behaves differently. For example, the amount of time needed to perform various operations (e.g., read operations, program operations, etc.) can vary from chip to chip, which can correspond to different charge pump efficiencies for different chips. It is desirable to be able to measure the efficiency of given charge pump for a variety of reasons. For example, a majority of the input current (Icc) used by a chip to perform an operation (also referred to as current burn or a variation thereof) is due to the operation of the charge pumps. Therefore, knowledge of the efficiency of a charge pump can provide valuable insight into the current burn and performance of the chip itself. In addition, if a charge pump's efficiency is known, various operating parameters of the charge pump can be modified (e.g., tweaked) to obtain NAND performance improvements.

For example, knowledge of a charge pump's efficiency can be leveraged to improve NAND performance characteristics such as to reduce cell programming time and/or reading time. If charge pump's efficiency is determined to be low (e.g., lower than an expected efficiency), then the charge pump's clock can be slowed. This will improve the charge pump's efficiency, but the tradeoff is a lower output current/voltage output from the charge pump. Conversely, if the charge's pump efficiency is relatively high, the charge pump clock rate can be increased, which enhances the current output but reduces the efficiency.

Micro-probing is a current technique used to determine the efficiency of a charge pump. Micro-probing includes measuring the output current drawn from a charge pump, measuring the input current drawn by the charge pump from an external supply, and calculating the ratio of two quantities. In some cases, charge pump efficiency may be determined as the ratio of the output current to the input current, i.e., $$\frac{I_{out}}{I_{in}}.$$

In other scenarios, the inverse ratio may be used to represent charge pump efficiency, i.e., $$\frac{I_{in}}{I_{out}}.$$

As an example, the efficiency of a charge pump may be stated as follows: for every 1 microamp of output from a charge pump, 4 microamps of input current are used, or alternatively, for every 4 microamps of input current supplied to the charge pump, it generates 1 microamp of output current. If using $$\frac{I_{out}}{I_{in}}$$

to represent charge pump efficiency, the efficiency is typically less than 1 (alternatively, greater than 1 if using $$\frac{I_{in}}{I_{out}}).$$

This is due to charge losses from parasitic capacitance, clock generators, and so forth.

While micro-probing provides some measure of charge pump efficiency, it is generally not an accurate one. Moreover, this technique can be used to measure the efficiencies of charge pumps for at most a few chips (e.g., 1-2 chips), and is not capable of providing a wafer-level measure of charge pump efficiency. Embodiments of the disclosed technology solve these technical problems by providing a charge pump efficiency determination technique that produces a more accurate measurement of charge pump efficiency, without requiring direct measurement the input or output currents of the charge pump.

A charge pump circuit includes a charge pump clock generator that supplies a clock signal to the charge pump. An edge of the clock signal (e.g., a rising or falling edge) may be used to pump charges to a capacitor, which stores the charge and distributes it to a load. For instance, the charge pump may supply an output current on every rising edge of the clock signal. The greater the load current being demanded, the more the capacitor needs to be charged, which in turn, corresponds to a greater number of clock cycles of the charge pump clock signal. Example embodiments of the disclosed technology leverage the proportionality between the current output of a charge pump and the number of clock edges of the charge pump clock signal that occur to supply that current output to determine an efficiency of the charge pump without having to directly measure the input or output currents of the charge pump. While the absolute amount of input current cannot be determined from a number of clock edges, the relative input current can be determined from a ratio of clock edges. For example, if a load is drawing 100 microamps of current from a charge pump, this would result in a certain number of clock edges. Then, if current drawn by the load is doubled to 200 microamps, the number of clock edges would similarly double. Example embodiments of the disclosed technology relate to a charge pump test configuration and method of operation that leverage this characteristic to calculate an input current to a charge pump under test, and then determine, based on a known output current being drawn, the efficiency of the charge pump.

More specifically, in example embodiments of the disclosed technology, a first charge pump is connected to a load that draws a known output (e.g., predetermined) output current. A first number of clock edges of a charge pump clock signal that occur over a first period of time that the output current is being drawn may then be determined. Then, a charge pump test configuration may be employed according to which a second charge pump (referred to herein as a charge pump under test (PUT)) is cascaded with the first charge pump such that an output current produced by the first charge pump is supplied as an input current to the PUT. A load drawing the same amount of output current as before may then be connected to the PUT, and a second number of clock edges that occur in the clock signal that feeds the first charge pump in order to supply the output current being drawn from the PUT may be determined for a period of time of the same (or substantially the same) duration as the first period of time. An efficiency of the PUT may then be determined as a ratio of the first number of clock edges to the second number of clock edges (if $$\frac{I_{out}}{I_{in}} \text{ is}$$

used as the measure of charge pump efficiency), or as the ratio of the second number of clock edges to the first number of clock edges (if $$\frac{I_{in}}{I_{out}}$$

is used as the measure of charge pump efficiency).

Embodiments of the disclosed technology thus provide a technical solution to the technical problem of determining the efficiency of a charge pump without having to directly measure an input current to the charge pump, which can be notoriously difficult to accurately measure. Example embodiments of the disclosed technology provide this technical solution in the form of a charge pump test configuration and corresponding method of operation that involves: 1) determining a first number of clock edges of a clock signal supplied to a first charge pump over a first period of time that a known output current is being drawn from the first charge pump; 2) connecting the first charge pump with a PUT in a cascaded manner according to which an output current of the first charge pump is supplied to the PUT as an input current, 3) determining a second number of clock edges of a clock signal supplied to the first charge pump over the same first period of time that the same output current is being drawn from the PUT, and 4) determining that efficiency of the PUT as the ratio of the first number of clock edges to the second number of clock edges, or vice versa. In this manner, the efficiency of the PUT and the input current to the PUT can be determined without having to perform direct current measurements, thereby improving the accuracy of the determination, and solving a technical problem of existing techniques for measuring charge pump efficiency.

Figure 1:
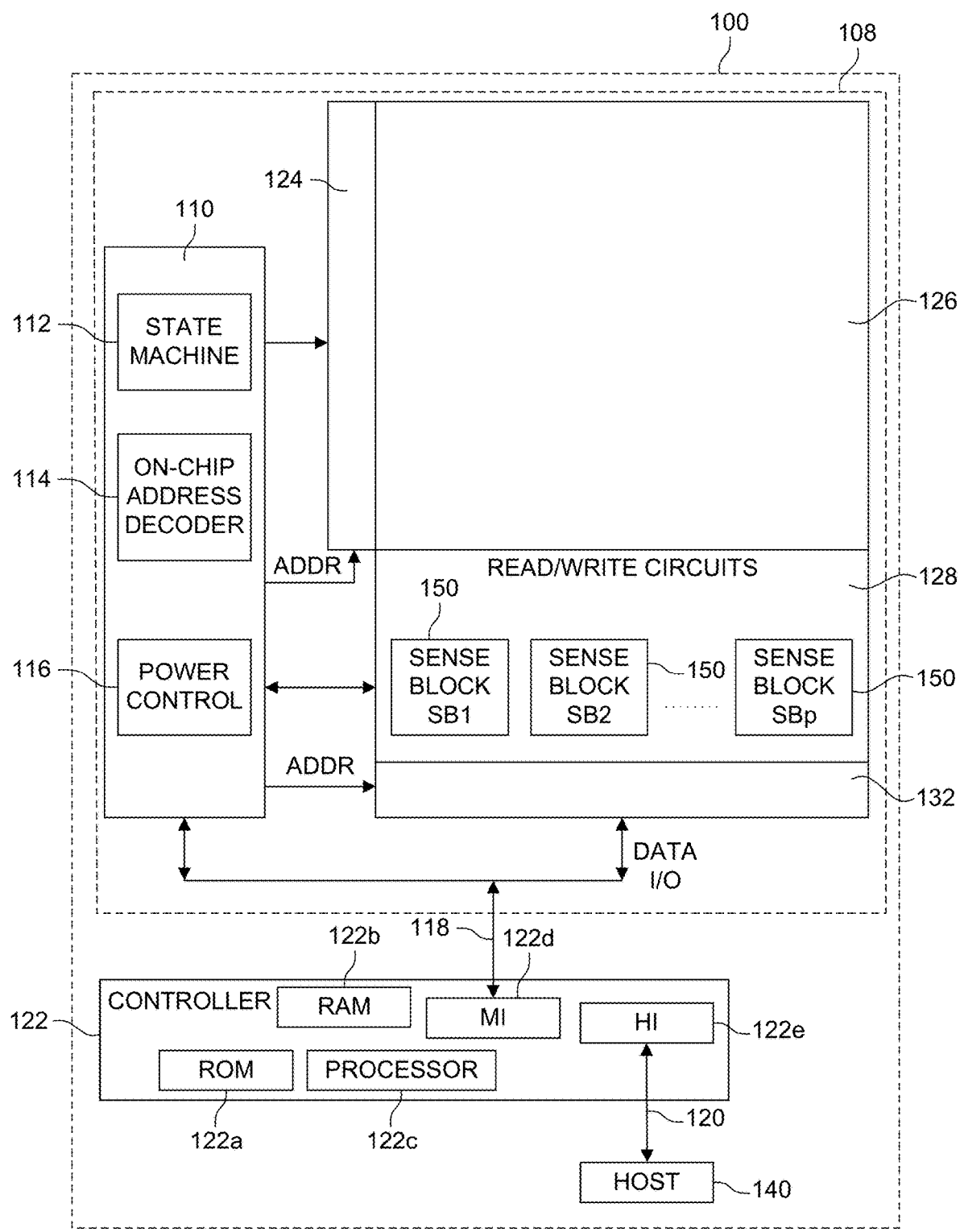
FIG. 1 is a block diagram of an example memory device, in connection with which, example embodiments of the disclosed technology can be implemented.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c—may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
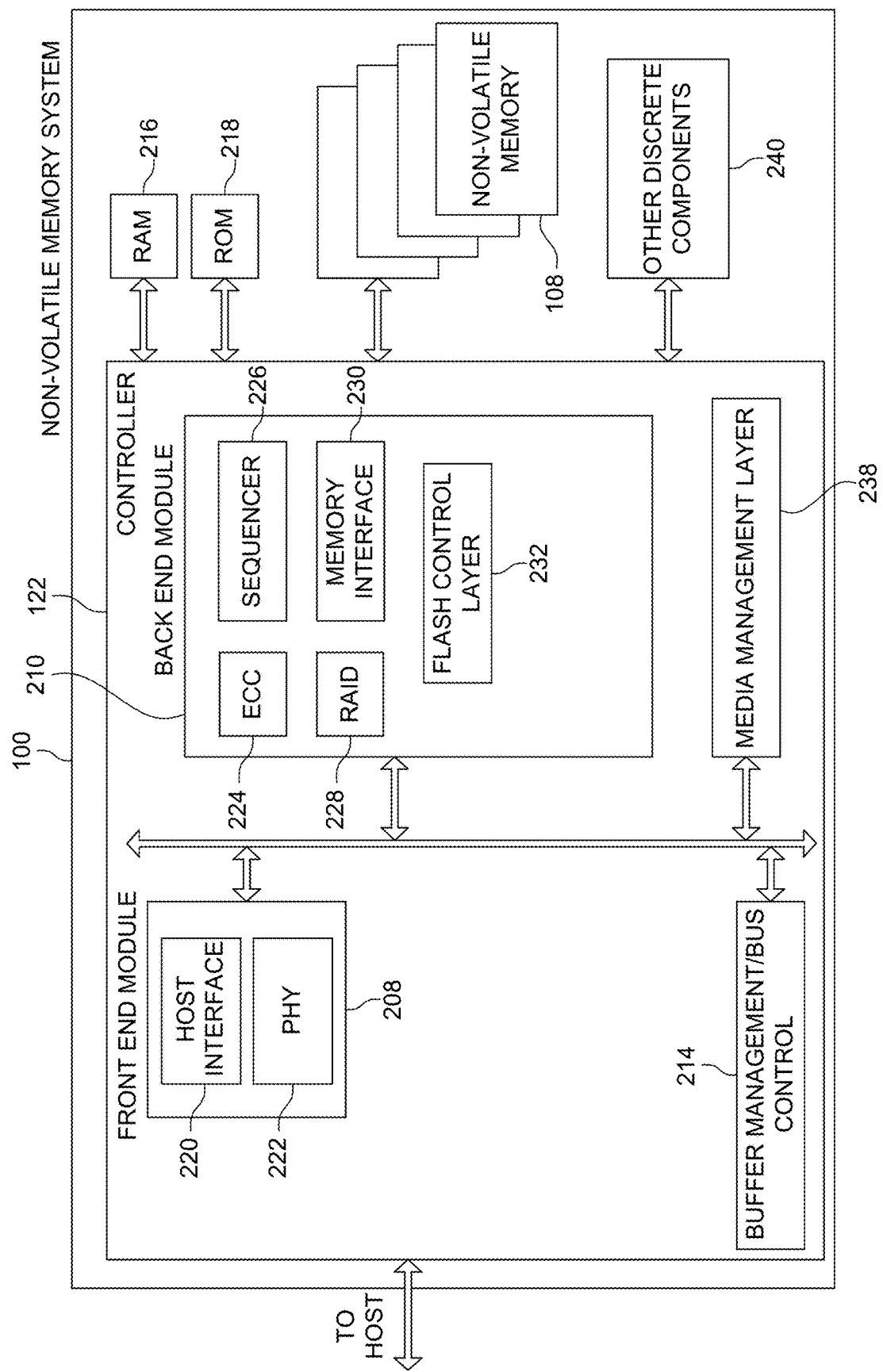
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
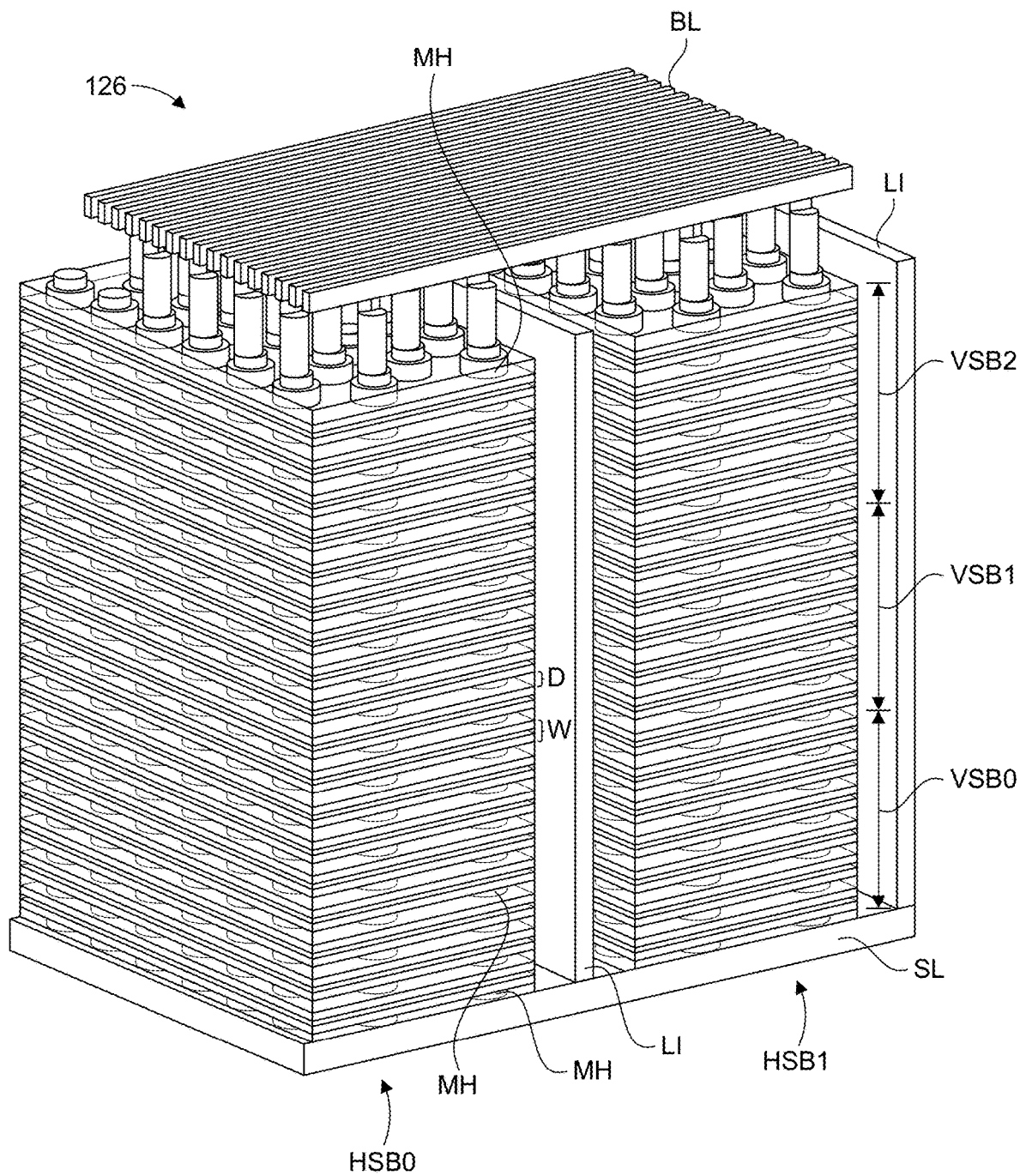
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

FIG. 6 depicts a charge pump circuit 600. The charge pump circuit 600 includes a charge pump 602 that is controlled based on a charge pump clock signal 604. For instance, the clock signal 604 may drive operation of the charge pump 602 such that the charge pump 602 produces an output current on each rising edge of the clock signal 604. Alternatively, the charge pump 602 may produce an output current on each falling edge of the clock signal 604. Assuming that the charge pump 602 operates based on the rising edge of the clock edge 604, the charge pump 602 would generate an output current to charge a capacitor 606 at each occurrence of rising edge of the clock signal 604. Eventually, in this manner, the stored capacitor charge may be increased to a point that the charge pump 602 is ultimately able to generate a desired target voltage.

If the clock signal 604 is continuously supplied to the charge pump 602, then the output voltage (VOUT) from the charge pump would continuously increase, which is not desirable. As such, to the charge pump circuit 600 includes a mechanism for modulating the charge pump clock signal 604 to maintain the voltage output VOUT of the charge pump 602 within a predetermined tolerance. In some cases, the tolerance may be a configurable, permissible deviation from a target voltage output.

More specifically, the charge pump circuit 602 may include a voltage divider configured to divide the output voltage 618 to produce a divided voltage 612. The voltage divider may be a resistor-based voltage divider that includes, for example, a first resistor 608 and a second resistor 610 capable of providing variable resistance to trim the output voltage 618 to produce the divided voltage 612. The divided voltage 612 is then fed to a comparator 614. The comparator 614 may be configured to compare the divided voltage 612 to a fixed reference voltage (VREF). In some cases, VREF may be the target output voltage, or a voltage that is a certain tolerance away from the target output voltage. The comparator 614, along with a flag sync component 616, may then function to control delivery of the charge pump clock signal to the charge pump 602 based on the comparison between the divided voltage 612 and the reference voltage VREF.

More specifically, when the divided voltage 612 is larger than the reference voltage VREF, the comparator output goes high. This causes a flag to bet set/unset to a first state. A flag sync component 616 receives the flag in the first state and the clock signal 604 as input. Based on the flag being in the first state, the component 616 stops the supply of the clock signal 604 to the charge pump 602, thereby causing the pump 602 to stop. This, in turn, causes the supply of output current from the charge pump 602 to cease. Then, as the capacitor slowly discharges, the output voltage 618 from the charge pump 602 would decrease as well. This would continue until the divided voltage 612 reaches a level that is below VREF, as determined by the comparator 614, at which point, the flag would be set/unset to a second state. Based on the flag being in the second state, the flag sync component 616 once again delivers the clock signal 604 to the charge pump 602, and the pump 602 starts up again. Operation of the charge pump circuit 600 may continue in this manner to regulate supply of the clock signal 604 to the charge pump 602, and thereby control the output voltage 618 of the charge pump 602. When the charge pump 602 is being first charged up, the clock signal 604 may be continuously provided. Thereafter, the clock signal 604 may be supplied intermittently based on the amount of load pulling down on the output voltage 618.

FIG. 7A schematically depicts a particular current output being drawn from a charge pump. FIG. 7B depicts a clock signal that controls an output of the charge pump of FIG. 7A. Referring first to FIG. 7A, a first charge pump 702 is depicted. The first charge pump 702 may be controlled using the a charge pump circuit configuration such as that depicted in FIG. 6. In an example embodiment, the first charge pump 702 may be connected to a load 708 that may draw a predetermined amount of output current 704 from the first charge pump 702. In the context of FIG. 7A, this output current 704 may be referred to as $I_{sink}$. Further, while $I_{sink}$ is illustratively shown as being 100 μA, it should be appreciated that any suitable value can be chosen for the predetermined output current 704 ($I_{sink}$) that the load 708 draws from the charge pump 702.

As previously noted, a clock signal is used to control the supply of output current from a charge pump. Referring now to FIGS. 7A and 7B together, in an example embodiment, a charge pump clock signal 710 may be supplied to the first charge pump 702 to control the supply of the output current 704 from the charge pump 702. More specifically, the clock signal 710 may be provided to the charge pump 702 to cause the charge pump 702 to supply the predetermined amount of output current 704 ($I_{sink}$) for a certain period of time 706 ($t_{dft}$). A first number of clock edges (e.g., both rising and falling edges) of the clock signal 710 may be determined (e.g., counted) during the period of time $t_{dft}$. Since the charge pump 702 is configured to deliver the output current 704 (which is drawn by the load 708) at each rising (or each falling) edge of the clock signal 710, in example embodiments, the first number of clock edges (e.g., M clock edges) is a number of clock edges that occur in the clock signal 710 over the course of the period of time $t_{dft}$ in order to produce the predetermined amount of output current 704 ($I_{sink}$). In some embodiments, the period of time $t_{dft}$ may be selected to be at least a threshold amount of time needed to provide at least a threshold number of clock edges to make an accurate determination of charge pump efficiency for another charge pump that can be connected to the first charge pump 702 in a cascaded fashion according to example embodiments of the disclosed technology. That is, as $t_{dft}$ increases, so too does the accuracy of the charge pump efficiency determination fora pump under test.

FIG. 7C schematically depicts a charge pump test configuration in which a pump under test is cascaded with the charge pump of FIG. 7A, according to example embodiments of the disclosed technology. FIG. 7D depicts a clock signal for the charge pump of FIG. 7A having a greater number of clock edges in connection with the charge pump test configuration depicted in FIG. 7C, according to example embodiments of the disclosed technology. In the charge pump test configuration depicted in FIG. 7C, a charge pump under test (PUT) 712 is connected to the first charge pump 702 such that an output current of the first charge pump 702 is provided as an input current 714 ($I_{in}$) to the PUT 712. Then, a load 708 that draws the same amount of output current 704 ($I_{sink}$) as in the case of FIG. 7A is connected to the PUT 712. Referring now to FIGS. 7C and 7D together, a second number of clock edges (e.g., both rising and falling edges) of a clock signal 716 supplied to the first charge pump 702 may then be determined (e.g., counted) for the same period of time $t_{dft}$, but this time, in connection with the charge pump test configuration of FIG. 7C.

In example embodiments, the second number of clock edges (e.g., N clock edges) of the clock signal 716 may be greater than the first number of clock edges (M clock edges) of the clock signal 710. This may be the case because, as noted earlier, the efficiency of a charge pump may be less than ideal, with the output current being less than the input current due to various forms of charge loss. As such, because an output current of the first charge pump 702 is being supplied as input current 714 to the PUT 712, and because the less-than-ideal efficiency of the PUT 712 results in some charge loss when generating the predetermined output current 704 from the input current 714, the first charge pump 702 may need to supply a larger current as the input current 714 to the PUT 712 than it would have to supply as an output current in the case of FIG. 7A to order to meet the same predetermined current draw from the load 708 in both scenarios. Thus, in example embodiments, because the output current from the first charge pump 702 in the configuration of FIG. 7C (which is the same as the input current 714 to the PUT 712) needs to be greater than the output current from the first charge pump 702 in the configuration of FIG. 7A, the second number of clock edges observed in the clock signal 716 (N clock edges) is greater than the first number of clock edges observed in the clock signal 710 (M clock edges).

In example embodiments, the efficiency of the PUT 712 may then be determined as a ratio of the first and second numbers of clock edges. If, for example, charge pump efficiency is represented as $$E = \frac{I_{out}}{I_{in}},$$

then E can be determined as $$\frac{1\text{st \# of clock edges}}{2\text{nd \# of clock edges}},$$

i.e., $$\frac{M}{N}.$$

in the example embodiment of FIG. 7C, $I_{out}$ for the PUT 712 is assumed to be a predetermined output current being drawn by the load 708 ($I_{sink}$). This predetermined output current may be 100 μA, for example. Further, in the example charge pump test configuration of FIG. 7C, $I_{in}$ to the PUT 712 is the output current of the first charge pump 702. Thus, for the example embodiment of FIG. 7C, $$E = \frac{I_{out}}{I_{in}} = \frac{I_{sink}}{I_{in}} = \frac{1\text{st \# of clock edges}}{2\text{nd \# of clock edges}} = \frac{M}{N}.$$

Alternatively, if charge pump efficiency is represented as $$E = \frac{I_{in}}{I_{out}},$$

then $$E = \frac{I_{in}}{I_{out}} = \frac{2\text{nd \# of clock edges}}{1\text{st \# of clock edges}} = \frac{N}{M}.$$

In example embodiments, the output current $I_{sink}$ drawn by the load 108 connected to the PUT 712 is based on the output current of the first charge pump 702, which is provided as input current 714 to the PUT 712 via the cascaded connection of the PUT 712 to the first charge pump 702. As such, in example embodiments, the input current 714 that is needed for the PUT 712 to generate the output current $I_{sink}$ should be within the capability of the first charge pump 702 to generate. In example embodiments, a measure of the sensitivity of the first charge pump 702, i.e., $P1_{Sen}$ is a function of the output current being drawn from the first charge pump 702 and the number of clock edges of the clock signal 710 observed for that output current.

That is, in the example embodiment of FIG. 7A, $$P1_{Sen} = \frac{I_{sink}}{1\text{st \# of clock edges}} = \frac{I_{sink}}{M}.$$

Because the output current of the first charge pump 702 is provided as the input current 714 ($I_{in}$) to the PUT 712 in the example embodiment of FIG. 7C, $I_{in}$ may then be given by: $I_{in} = P1_{Sen} * 2\text{nd \# of clock edges} = P1_{Sen} * N$. Then, the efficiency of the PUT 712 ($PUT_{eff}$)—if represented as $$\frac{I_{out}}{I_{in}} = \frac{I_{sink}}{I_{in}}$$

—is given by $$\frac{I_{sink}}{N * P1_{sen}} = \frac{I_{sink}}{N * (I_{sink}/M)} = \frac{M}{N}.$$

Alternatively, the efficiency of the PUT 712 ($PUT_{eff}$)—if represented as $$\frac{I_{in}}{I_{out}} = \frac{I_{in}}{I_{sink}}$$

—is given by $$\frac{N * P1_{sen}}{I_{sink}} = \frac{N * (I_{sink}/M)}{I_{sink}} = \frac{N}{M}.$$

FIG. 8 depicts simulation results 800 for the charge pump test configuration depicted in FIG. 7C, according to example embodiments of the disclosed technology. The simulation results 800 depict a first vertical line 802 and a second vertical line 804. The period of time that elapses between a first point in time corresponding to line 802 and a second point in time corresponding to line 804 may be a portion (e.g., a snapshot) of the total time $t_{dft}$ over which the clock edge counting is performed. The first column of voltage values may represent voltages at the point in time corresponding to line 804. The second column of voltage values may represent average voltages over the course of the time period that elapses between line 802 and line 804.

The simulation results 800 correspond to a charge pump (Vx2) and a charge pump under test (Vx4). The charge pump Vx2 may be the first charge pump 702, and the charge pump under test Vx4 may be the PUT 712. The first row provides voltage output values for the charge pump Vx2, which may be the first charge pump 702 in the configuration of FIG. 7A (without the PUT 712 cascaded thereto). The second row provides voltage values for a clock signal 806 driving the charge pump Vx2 (e.g., the clock signal 710 supplied to the first charge pump 702 in the configuration of FIG. 7A). As shown, when the clock signal 806 is at a logic low cell corresponding to line 804, the voltage is −27.881 µV (effectively 0V). The average value of the clock signal 806 between line 802 and line 804 is 778.71 mV.

The third row provides output voltage values for when the charge pump Vx2 (e.g., first charge pump 702) and the PUT Vx4 (e.g., PUT 712) is cascaded thereto. As shown, these values are lower than for charge pump Vx2 when Vx4 is not cascaded thereto, which may be due to charge loss by virtue the output current of Vx2 being supplied as an input current to Vx4. The fourth row provides output voltages values for Vx4 when cascaded to Vx2, and the fifth row provides voltage values corresponding to a clock signal 808 (e.g., clock signal 716) supplied to Vx2 (e.g., the first charge pump 702) when Vx4 (e.g., PUT 712) is cascaded thereto. As depicted in FIG. 8, as the voltage output of charge pump Vx4 begins to decline (e.g., Vx4 is being discharged), a greater number of clock edges occur for the clock signal 808 in order to increase an output current of the charge pump Vx2, which in turn, increases the input current supplied to Vx4, thereby increasing its output voltage.

FIG. 9 depicts simulation results 900 for the charge pump test configuration depicted in FIG. 7C over a longer time horizon than the simulation results of FIG. 8, according to example embodiments of the disclosed technology. In particular, a period of time between the vertical line 902 and the vertical line 904 may be the time $t_{dft}$, in some embodiments. The clock signals (and other voltage curves) appears as solid blocks in FIG. 9 due, for example, to the large number of clock edges observed for clock signals over the course of the time period $t_{dft}$. The simulation results 800 may correspond to a small portion of the time period $t_{dft}$.

FIG. 10 is a flowchart of an illustrative method 1000 of operation of the charge pump test configuration depicted in FIG. 7C to measure the efficiency of a charge pump under test according to example embodiments of the disclosed technology. In example embodiments, the method 1000 may be performed, at least in part, by the controller 122 (FIG. 1) or by a dedicated charge pump test controller.

At block 1002 of the method 1000, a first charge pump may be connected to a load that draws a predetermined amount of output current from the first charge pump. For instance, as depicted in FIG. 7A, the load 108 may be connected to the first charge pump 702 to draw the predetermined amount of output current $I_{sink}$. At block 1004 of the method 1000, a charge pump clock signal (e.g., clock signal 710) is supplied to the first charge pump to control a supply of the output current (e.g., $I_{sink}$) to the first charge pump. Then, at block 1006 of the method 1000, the controller may determine a first number of clock edges (e.g., M clock edges) of the charge pump clock signal for a first period of time ($t_{dft}$).

At block 1008 of the method 1000, a charge pump under test (PUT) is connected to the first charge pump in a cascaded fashion such that an output current of the first charge pump is supplied as an input current to the PUT. For instance, the PUT 712 may be cascaded to the first charge pump 702, as shown in the configuration of FIG. 7C. Then, at block 1010 of the method 1000, the PUT is connected to a load that draws the same predetermined amount of output current as the load to which the first charge pump is connected at block 1002. For instance, PUT 712 is connected to load 108, which draws the same predetermined amount of output current $I_{sink}$.

At block 1012 of the method 1000, a charge pump clock signal is supplied to the first charge pump to control a supply of the output current from the first charge pump, and as such, a supply of the output current from the PUT due to the cascaded connection between the first charge pump and the PUT. For instance, the clock signal 716 is provided to the first charge pump 702 to control an output current of the first charge pump 702, which is the same as the input current 714 to the PUT 712. This, in turn, results in indirect control of the output current generated by the PUT 712. At block 1014 of the method 1000, a second number of clock edges of the charge pump signal supplied at block 1012 may be determined for a second period of time equal in duration to the first period of time. For instance, the controller may determine the second number of clock edges (N clock edges) observed for the clock signal 716 over the course of the time period $t_{dft}$.

Then, at block 1016 of the method 1000, the efficiency of the PUT is determined based on a ratio between the first number of clock edges and the second number of clock edges. In some embodiments, the efficiency of the PUT is determined as the ratio of the first number of clock edges to the second number of clock edges, while in other embodiments, the efficiency of the PUT can be determined as the ratio of the second number of clock edges to the first number of clock edges. For instance, referring to the example embodiment of FIG. 7C, the efficiency of the PUT 712 ($PUT_{eff}$)—if represented as $$\frac{I_{out}}{I_{in}} =$$

is given by $$\frac{2\text{nd \# of clock edges}}{1\text{st \# of clock edges}} = \frac{M}{N}.$$

Alternatively, the efficiency of the PUT 712 ($PUT_{eff}$)—if represented as $$\frac{I_{in}}{I_{out}}$$

—is given by $$\frac{1\text{st \# of clock edges}}{2\text{nd \# of clock edges}} = \frac{N}{M}.$$

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In an embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in an embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A method of determining an efficiency of a charge pump under test (PUT), the method comprising:
   providing a first charge pump clock signal to a first charge pump to control a supply of a predetermined output current being drawn by a load connected to the first charge pump;
   determining a first number of clock edges of the first charge pump clock signal over a first period of time that the predetermined output current is drawn by the load;
   cascading the PUT to the first charge pump;
   providing a second charge pump clock signal to the first charge pump after the PUT is cascaded to the first charge pump to control an output current generated by the first charge pump;
   determining a second number of clock edges of the second charge pump clock signal over a second period of time having substantially the same duration as the first period of time; and
   determining the efficiency of the PUT based on the first number of clock edges and the second number of clock edges.

2. The method of claim 1, wherein cascading the PUT to the first charge pump comprises establishing a connection between the PUT and the first charge pump such that the output current generated by the first charge pump is provided as an input current to the PUT.

3. The method of claim 2, further comprising:
   connecting the load to the PUT; and
   causing the load to draw the predetermined output current from the PUT that is cascaded to the first charge pump, wherein, responsive to the second clock signal being provided to the first charge pump, the PUT generates the predetermined output current from the output current of the first charge pump provided as the input current to the PUT.

4. The method of claim 1, wherein the second number of clock edges is greater than the first number of clock edges in order to compensate for charge loss across the PUT.

5. The method of claim 1, wherein the efficiency of the PUT is one of: i) a first ratio of the first number of clock edges to the second number of clock edges, or ii) a second ratio of the second number of clock edges to the first number of clock edges.

6. The method of claim 1, further comprising:
   determining a value of an input current to the PUT cascaded to the first charge pump based on the efficiency of the PUT and the predetermined output current drawn by the load.

7. The method of claim 1, further comprising:
   selecting a duration of the first period of time to ensure at least a threshold accuracy of the determined efficiency of the PUT.

8. A system for determining charge pump efficiency, comprising:
   a first charge pump;
   a charge pump under test (PUT) configured to be cascaded to the first charge pump;

a clock generator; and a charge pump test controller configured to:
- control a first charge pump clock signal generated by the clock generator and provided to the first charge pump in order to supply a predetermined output current to a load connected to the first charge pump;
- determine a first number of clock edges of the first charge pump clock signal over a first period of time that the predetermined output current is drawn by the load;
- control a second charge pump clock signal generated by the clock generator and provided to the first charge pump after the PUT is cascaded to the first charge pump, the control of the second charge pump clock signal controlling an output current generated by the first charge pump;
- determine a second number of clock edges of the second charge pump clock signal over a second period of time having substantially the same duration as the first period of time; and
- determine the efficiency of the PUT based on the first number of clock edges and the second number of clock edges.

9. The system of claim 8, wherein the PUT is cascaded to the first charge pump by establishing a connection between the PUT and the first charge pump such that the output current generated by the first charge pump is provided as an input current to the PUT.

10. The system of claim 9, wherein the load is connected to the PUT and draws the predetermined output current from the PUT, and where charge pump test controller is configured to control the second charge pump clock signal to cause the PUT to generate the predetermined output current from the output current of the first charge pump provided as the input current to the PUT.

11. The system of claim 8, wherein the second number of clock edges is greater than the first number of clock edges in order to compensate for charge loss across the PUT.

12. The system of claim 8, wherein the efficiency of the PUT is one of: i) a first ratio of the first number of clock edges to the second number of clock edges, or ii) a second ratio of the second number of clock edges to the first number of clock edges.

13. The system of claim 8, wherein the charge pump test controller is further configured to:
- determine a value of an input current to the PUT cascaded to the first charge pump based on the efficiency of the PUT and the predetermined output current drawn by the load.

14. The system of claim 8, wherein the charge pump test controller is further configured to:
- select a duration of the first period of time to ensure at least a threshold accuracy of the determined efficiency of the PUT.

15. A non-transitory computer-readable media storing executable instructions that when executed by a controller cause a method of determining an efficiency of a charge pump under test (PUT) to be performed, the method comprising:
- providing a first charge pump clock signal to a first charge pump to control a supply of a predetermined output current being drawn by a load connected to the first charge pump;
- determining a first number of clock edges of the first charge pump clock signal over a first period of time that the predetermined output current is drawn by the load;
- after the PUT has been cascaded to the first charge pump, providing a second charge pump clock signal to the first charge pump to control an output current generated by the first charge pump;
- determining a second number of clock edges of the second charge pump clock signal over a second period of time having substantially the same duration as the first period of time; and
- determining the efficiency of the PUT based on the first number of clock edges and the second number of clock edges.

16. The non-transitory computer-readable media of claim 15, wherein the PUT is cascaded to the first charge pump via a connection between the PUT and the first charge pump that causes the output current generated by the first charge pump to be provided as an input current to the PUT.

17. The non-transitory computer-readable media of claim 16, wherein the load is connected to the PUT, the method further comprising:
- controlling the second charge pump clock signal to cause the PUT to generate the predetermined output current from the output current of the first charge pump provided as the input current to the PUT.

18. The non-transitory computer-readable media of claim 15, wherein the second number of clock edges is greater than the first number of clock edges in order to compensate for charge loss across the PUT.

19. The non-transitory computer-readable media of claim 15, wherein the efficiency of the PUT is one of: i) a first ratio of the first number of clock edges to the second number of clock edges, or ii) a second ratio of the second number of clock edges to the first number of clock edges.

20. The non-transitory computer-readable media of claim 15, the method further comprising:
- determining a value of an input current to the PUT cascaded to the first charge pump based on the efficiency of the PUT and the predetermined output current drawn by the load.

* * * * *